United States Patent
Boll et al.

(10) Patent No.: US 6,603,322 B1
(45) Date of Patent: Aug. 5, 2003

(54) PROBE CARD FOR HIGH SPEED TESTING

(75) Inventors: Harry J. Boll, Naples, FL (US); Gregory G. Boll, Naples, FL (US)

(73) Assignee: GGB Industries, Inc., Naples, FL (US)

( * ) Notice: Subject to any disclaimer, the term of this patent is extended or adjusted under 35 U.S.C. 154(b) by 943 days.

(21) Appl. No.: 08/764,353

(22) Filed: Dec. 12, 1996

(51) Int. Cl.⁷ .............................................. G01R 1/06
(52) U.S. Cl. ..................... 324/754; 324/761; 324/762
(58) Field of Search ............................... 324/754, 761, 324/762, 755; 439/482

(56) References Cited

U.S. PATENT DOCUMENTS

| | | | |
|---|---|---|---|
| 4,780,670 A | 10/1988 | Cherry | 324/158 P |
| 4,783,625 A | 11/1988 | Harry et al. | 324/158 P |
| 5,148,103 A | 9/1992 | Pasiecznik | 324/158 P |
| 5,323,107 A | 6/1994 | D'Souza | 324/158 P |
| 5,486,770 A * | 1/1996 | Johnson | 324/762 |
| 5,670,889 A * | 9/1997 | Okubo et al. | 324/762 |

OTHER PUBLICATIONS

IBM Technical Disclosure Bulletin vol. 20 No. 11B Apr. 1978.

International Test Conference 1992 Paper 43.2 E. Subramanian, R. Nelson (unavailable month).

EE–Evaluation Engineering, Sep. 1992, pp. 42,45,47, 48,53 R. Nelson, M. Bonham.

International Test Conference 1992 Paper 43.1 J.Kister, R.L.Franch (unavailable month).

* cited by examiner

*Primary Examiner*—Vinh P. Nguyen
(74) *Attorney, Agent, or Firm*—Werner H. Schroeder

(57) ABSTRACT

Epoxy probe cards are modified by mounting passive and/or active electronic components on the insulating surface of the probe card and connecting those components to the probe wires with short, electrically conductive lines that are formed on the probe card surface by printed circuit techniques. Ordinary wire probes may be interspersed with coaxial probes and probes with electrically conducting tips bonded to electrically insulating shanks. An auxiliary printed circuit board containing additional electronic components may be included to accommodate especially sensitive test points. The resulting probe structure is intended to extend the frequency range of the well-developed epoxy probe card technology while retaining its ruggedness and low cost features.

5 Claims, 8 Drawing Sheets

PROBE CARD FOR HIGH SPEED TESTING

FIELD OF THE INVENTION

This invention relates to a probe device for testing high speed integrated circuits such as amplifiers, microprocessors, signal processors and memories as well as circuit boards which may include integrated circuits and/or other electronic elements.

BACKGROUND OF THE INVENTION

Testing of integrated circuits (IC's), also called chips or dies is an important part of the design and manufacture of the circuits. Advantageously, initial testing is performed while the chips are still held together as parts of a semiconductor slice or wafer. If the testing shows that the design or the process employed to manufacture the chips is faulty then the design or manufacturing process can be altered to produce the desired result.

The development of higher speed integrated circuits has required the development of new testing techniques. In particular, the use of ordinary wire probes to make connection between the chip and the testing apparatus can no longer be employed because the wire probe inductance produces undesirable large voltage transients as the probe currents change during testing and capacitive and inductive coupling between probe wires generate extraneous signals that confuse the test results. There are essentially six separate functions that should be performed to accurately and reliably test high speed integrated circuits:

1. The probe wires carrying high speed signals should be shielded from one another as much as practicable to minimize coupling between the probe wires.
2. The probe wires carrying high speed switching currents should be low inductance to minimize current induced voltage transients.
3. The probe tips should have mechanical compliance to allow each individual probe tip to move independently of the others to assure reliable contacts in the presence of unavoidable small variations in the placement of the probe tips and unavoidable nonplanarity of the slice or probe mounting during testing.
4. The probe tips that contact the circuit to be tested should be small in size so that chips with closely spaced test pads may be tested.
5. The probe apparatus should be mechanically durable for long lasting reliable operation.
6. The connections between the probe assembly and the testing apparatus should be effected with minimal degradation of the testing signals.

Satisfactory solutions to many of the above requirements that have enjoyed considerable commercial success are disclosed in U.S. Pat. No. 4,871,964 issued Oct. 3, 1989 and U.S. Pat. No. 5,373,231 issued on Dec. 13, 1994 and assigned to the same assignee as the present invention. However, when the application requirements are not so stringent we seek a less expensive structure.

The invention disclosed here describes apparatus that meets the above requirements and is advantageous in that it is simple and inexpensive to construct and is an extension of a well-developed technology. Possible disadvantages are that the probe assembly may not be as high speed and the probe tips may be less mechanically compliant than the aforementioned solutions. However, for a large number of probe testing applications the new apparatus is expected to be superior due to lower cost and it is expected to be very rugged and allow smaller probe tip separation.

Although this invention is primarily directed toward testing of integrated circuits while still part of a semiconductor slice, the apparatus may also be adapted for testing larger structures such as printed circuit boards or ceramic substrates that may include packaged or unpackaged integrated circuit chips.

SUMMARY OF THE INVENTION

This invention describes novel electronic probe apparatus for testing integrated circuits in which a prior art epoxy probe card is modified to include electronic components such as capacitors, inductors, resistors, transformers and/or active elements such as transistors, amplifiers or analog to digital converters. In addition, some of the probe wires are surrounded with an insulating layer and an outer conductive sheath to form coaxial cables for the transmission of high speed signals. The probe apparatus may include novel probe structures consisting of an electrically insulating shank with an electrically conductive tip for testing those parts of a chip that require very low capacitance and/or high impedance testing. A relatively large area conductive layer over the top and/or the bottom of the probe card serves as a ground plane to reduce the coupling between adjacent probe wires and to reduce the coupling between the probe wires and any external circuitry.

BRIEF DESCRIPTION OF THE DRAWINGS

It is to be understood that corresponding designation numbers are used in the various drawings for corresponding elements that have the same function. The drawings are not necessarily to scale.

DETAILED DESCRIPTION

Figure 1:
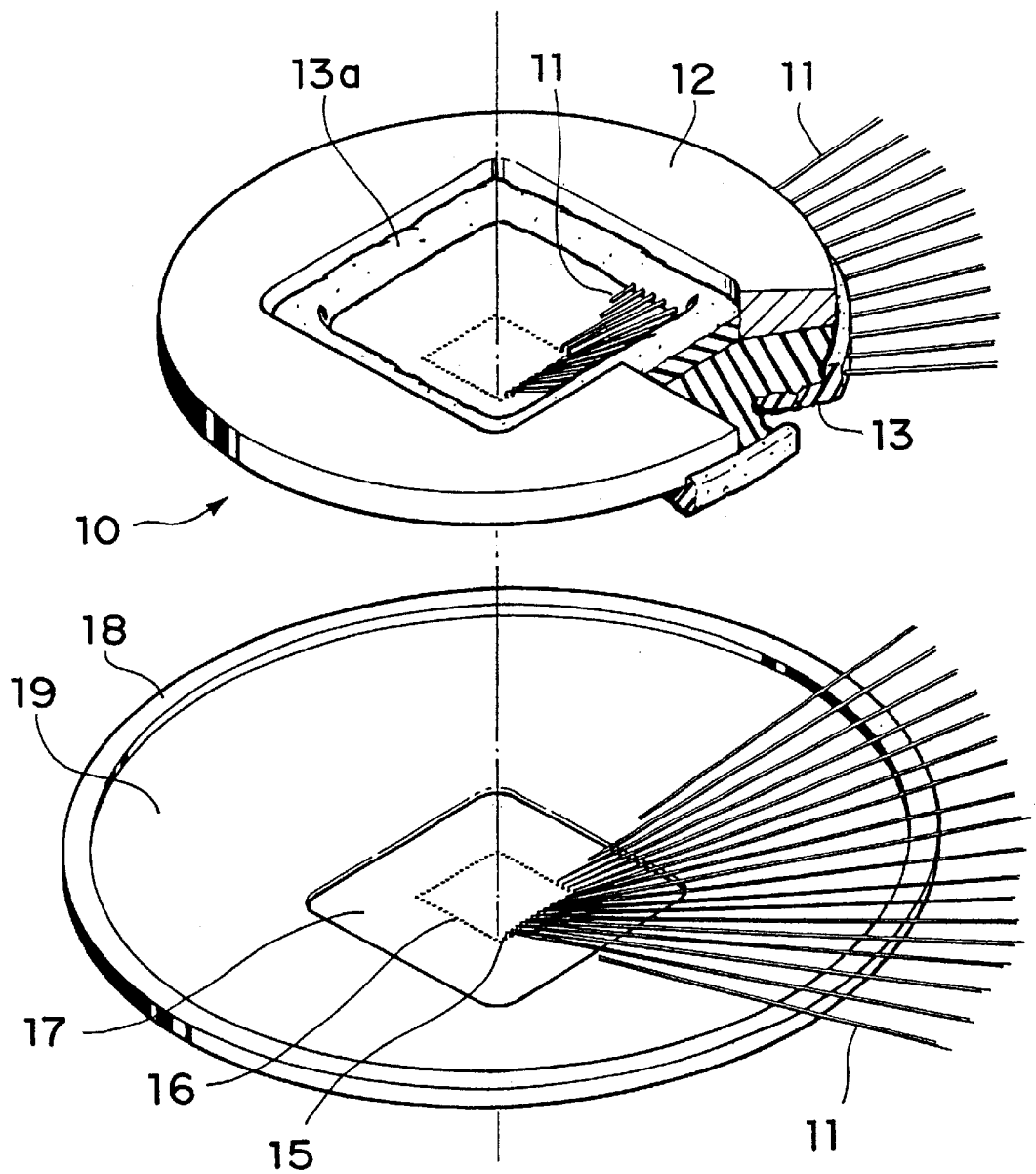
FIG. 1 shows a perspective drawing of a probe device representing prior art and illustrates the method of construction.

Referring now to FIG. 1, there is shown a perspective view of a probe device 10, commonly referred to as an epoxy probe card, for testing electronic circuits in accordance with the prior art. Probe wires 11 and a stiffening ring 12 are molded into an electrically insulating material 13. The probe wires extend through the insulating material 13 so both ends of the probe wires are exposed. During the construction of such a probe assembly, the tips 15 of the probe wires 11 are placed into accurately positioned holes 16 punched through a thin membrane 17. The shank of each probe wire is allowed to rest on a circular ring 18 that is part of a conical member 19 that forms the surface on which the probe card is formed. The upper surface of the conical member 19 is approximately 1 mm below the probe wires as they rest on the ring 18 and are held in place by the holes 16. The result is a circular array of probe wires, usually made of tungsten metal, radiating outward from the tips in the form of a shallow cone. A liquid insulator such as a thermosetting polymer is then flowed over the central region of the wires and a metal ring 12 with a cone angle matching that of the conical member 19 is placed atop the liquid insulator. The polymer is then allowed to harden after which the probe wires are held firmly in place by the hardened polymer which also electrically insulates the probe wires from one another. The membrane 17, the supporting ring 18 and the circular conical member 19 are then removed to leave a free standing probe assembly 10 that can then be mounted on a circuit board or other support and connections can be made between the probe wires and testing instruments. The advantage of this construction method is that the tips of the probe wires are accurately held in place by the holes in the membrane and the holes can be accurately formed by photolithography or by computer controlled milling. The slow setting of the polymer assures that the wires are free of stress so that when the probe assembly is removed from the ring 18, cone 19 and the holes 16, the probe tips remain substantially in the same position as the holes in the membrane. The ring 12 constructed of metal, ceramic or glass acts as a mechanical stiffener to provide rigidity so that stresses induced in the probe assembly during mounting and connecting the probe to a circuit board causes minimal flexure of the probe assembly. It is the inexpensive and accurate construction of such probe assemblies that has made them a standard in the industry. Although other thermosetting materials other than epoxy may be employed, such probe assemblies are nonetheless referred to as epoxy probe cards. It is to be understood that the above description of the construction of an epoxy probe card is merely a brief outline of the construction method and is only meant as background to form a basis for the invention disclosed here. Those skilled in the art may employ many variations in construction methods but the end result is generally that shown in 10 of FIG. 1.

Figure 2:
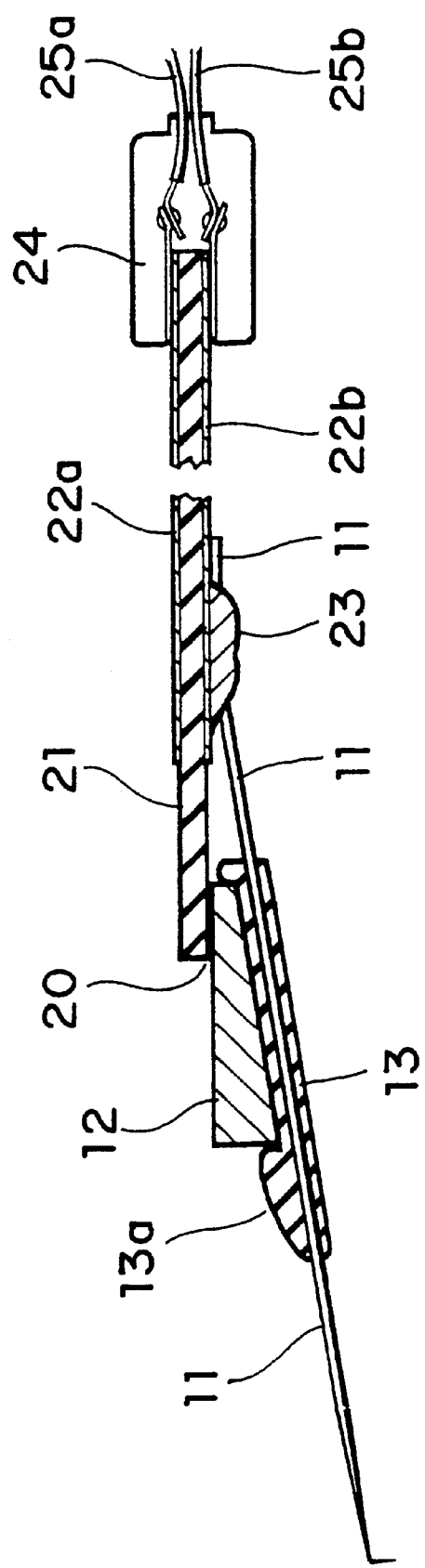
FIG. 2 shows a crossectional view of the epoxy probe card mounted on a circuit board with electrical connection indicated.

Such a probe assembly can then be mounted on a printed circuit board 21 as shown in FIG. 2. The circuit board 21 acts as a convenient connection medium between the probe needles 11 and the testing apparatus. The probe wires 11 are connected to conductive traces 22a and 22b which may be arrayed on both sides of the board 21, and the traces in turn are connected via a connector 24 to the wires 25a and 25b that connect to the testing instruments(not shown). It is to be understood that although only two connecting wires are shown in FIG. 2, the testing of complex chips may require dozens and even hundreds of connecting wires. Also some of the wires may be transmission lines such as coaxial cable or twin line. In the prior art, circuit components such as bypass capacitors, amplifiers, voltage limiters and/or signal filters have been included on the printed circuit board 21.

Unfortunately such a probe assembly is not well suited for high frequency testing because the long, thin probe wires 11 have substantial inductance and the probe wires are embedded in an insulating material allowing objectionable capacitive and mutual inductive coupling between them. The thrust of this invention is to place some of these electronic components on the epoxy probe card itself to minimize the objectionable probe inductance and coupling phenomena.

An improved probe structure employing conductive epoxy was proposed by Valentine and Wagner (IBM Technical Disclosure Bulletin Vol. 20 No. 11B April, 1978). Unfortunately this structure has not found general use because the construction is difficult and the electrically conducting epoxy is not fluid enough to allow accurate, stress-free positioning of the needles. Another structure, the membrane probe, (see for example U.S. Pat. No. 5,148,103) has been produced with some success, but is not nearly as mechanically durable as the epoxy probe card.

A primary object of this invention is to introduce new materials and construction techniques to improve the high frequency performance of the epoxy probe card structure by reducing the self inductance and capacitance of the probe needles and the length over which they can couple to one another. This may be accomplished by placing miniature electronic components on the insulating surface 13a of the epoxy probe card and electrically connecting those components to appropriate probe needles.

Figure 3:
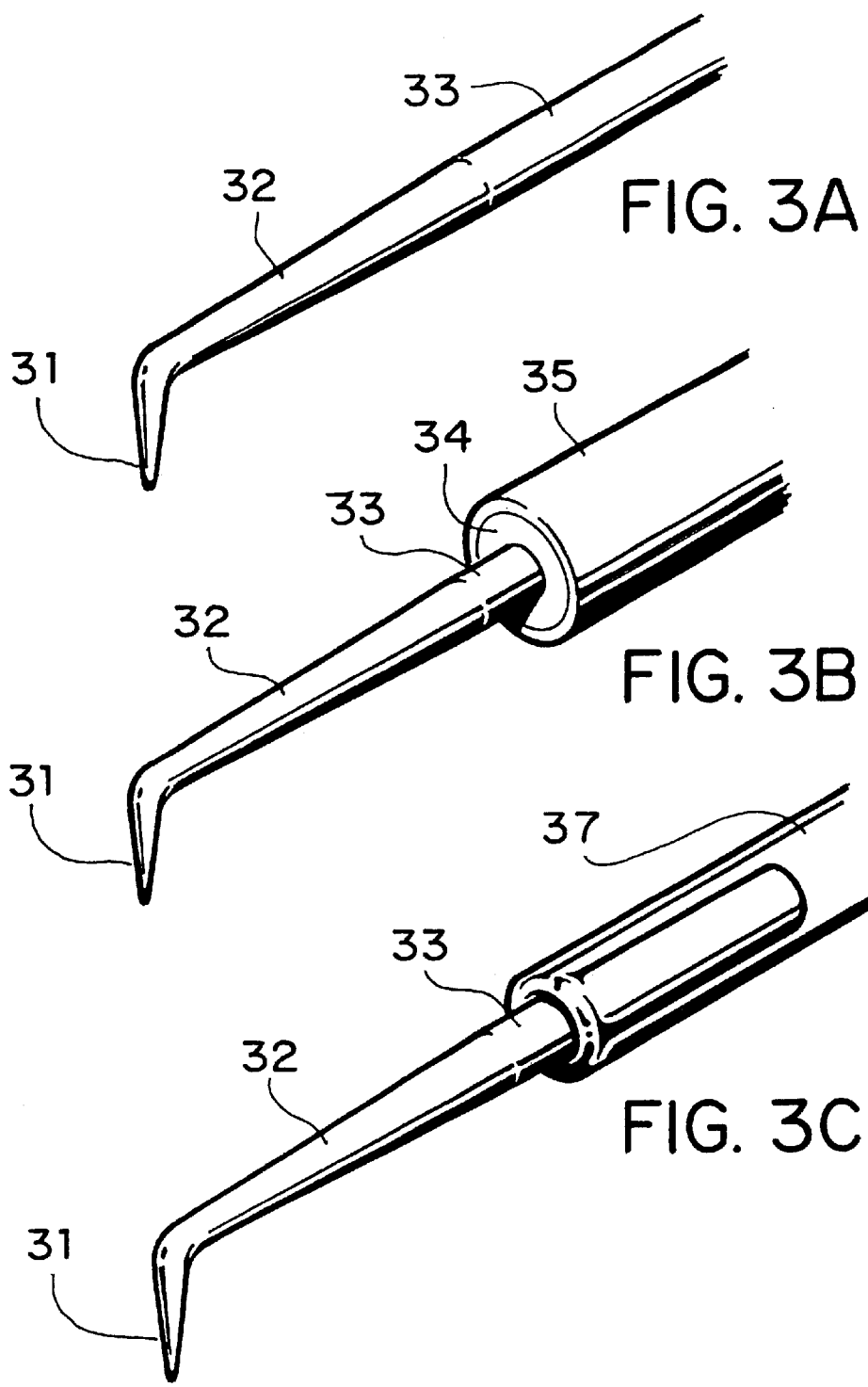
FIGS. 3A, 3B and 3C show perspective drawings of the tip region of the three probe types of the present invention.

In the preferred embodiments to be described, there may be three different types of probe needles shown in FIGS. 3A, 3B and 3C. Each of the probe needles may have a downward bent tip portion 31, a sometimes conically tapered section 32, and a long shank portion 33. The probe needle FIG. 3A, corresponding to prior art, is a bare wire that may be employed to connect power or common to the circuit under test or to carry relatively slowly varying signals. Probe 3B is a second type of probe in which the shank portion 33 is surrounded by an insulator 34 which in turn is surrounded by a metallic shield 35. The shank 33, the insulator 34 and the shield 35 form a coaxial transmission line that is useful for carrying high frequency signals. Alternatively, by employing a very thin insulating material 34, the B type probe can also be employed to apply power or a slowly varying control voltage. With a very thin insulating layer 34, the relatively large capacitance of the shank 33 to the shield 35 acts as a bypass capacitor to conduct high frequency current surges to ground.

A third type of probe needle shown in FIG. 3C is identical to that of FIG. 3A except that the shank portion 33 is much shorter and may be embedded as shown in an electrically insulating shank extension 37. Alternatively, instead of embedding the metallic tip as shown, the metallic tip may be fastened to the insulating shank by any method including the use of adhesives or by electroplating methods. The extension 37 may be glass or ceramic for example or any other insulating material and may be the same length as the shank portions of the probes shown in FIGS. 3A and 3B. All three needle types are long enough to allow them to rest on the ring 18 as shown in FIG. 1.

Figure 4:
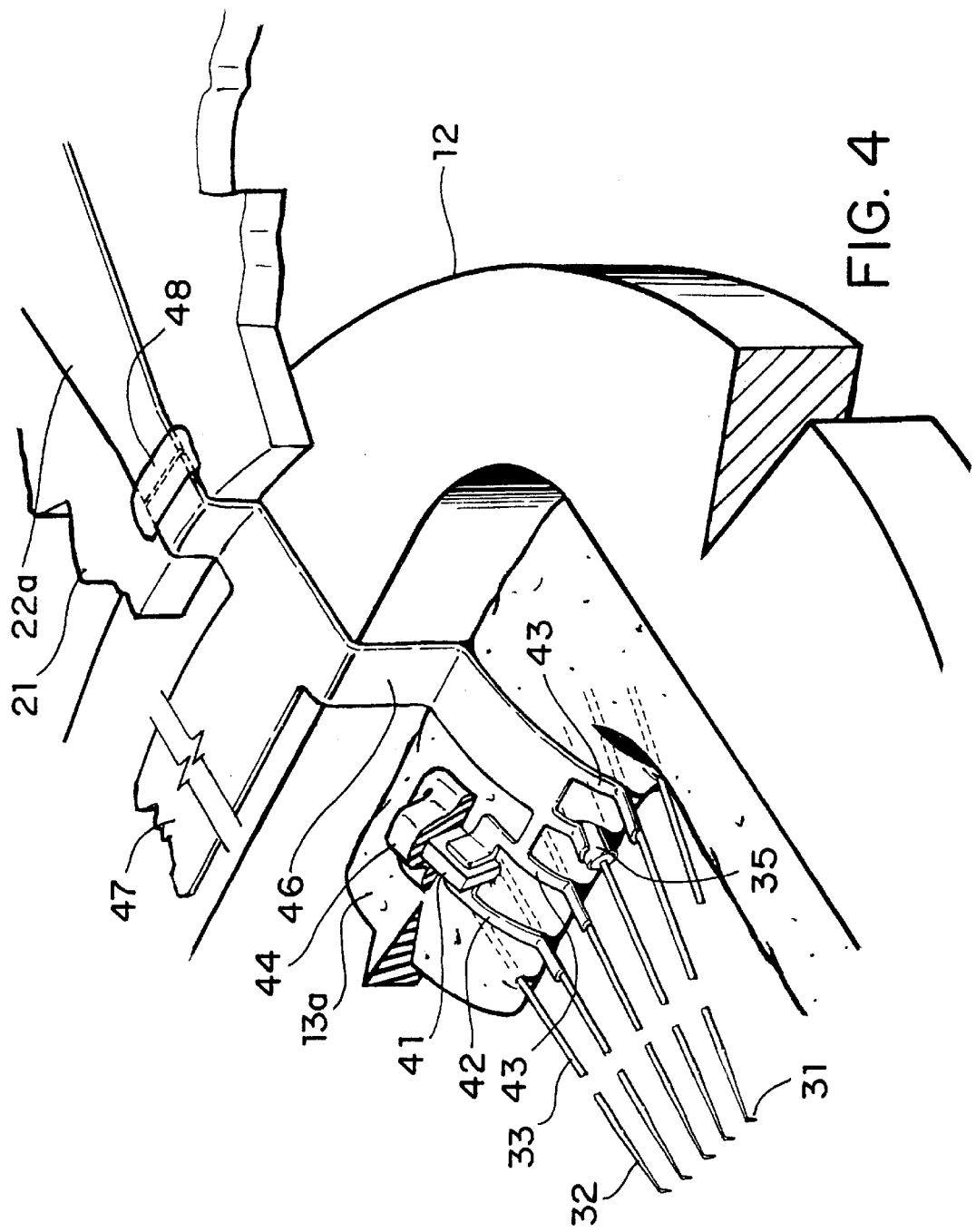
FIG. 4 shows the details of the connection between the probes and a bypass capacitor.

A probe card employing any or all of the probe wires of FIGS. 3A, 3B and 3C is then constructed as outlined above in conjunction with FIG. 1. After the epoxy material 13 has hardened and before or after the probe assembly has been mounted on a probe card as indicated in FIG. 2, circuit components may be mounted on the surface of the epoxy near the probe tips as shown in FIG. 4, or between the probe wires or on the bottom surface of the epoxy probe card. Such electronic components may include but are not limited to capacitors, resistors, inductors, filters, baluns, transistors, impedance matching networks or complex integrated circuits such as amplifiers or analog to digital converters. By way of illustration, in FIG. 4, a bypass capacitor 41 is mounted to the epoxy material 13a that makes up the holder for the probe wires. This capacitor may be connected to the probe wires as shown by forming electrically conducting path or paths 43 with an electrically conducting ink. The ink may be applied manually with a brush or it may be applied semiautomatically using silk screening methods or fully automatically by means of computer aided drawing apparatus. The ink may be highly conductive to minimize electrical voltage drops or it may be somewhat resistive to damp out unwanted resonant modes that could interfere with accurate testing. To minimize the inductance, the conductive ink connections 43 should be short and wide and the capacitor should be mounted as near to the probe tips as practicable. The conductive ink can also connect together those probe wires that require common electrical connection. To improve the mechanical and electrical integrity of the electrical connections between the probe needles and the electronic components, it may be desirable to deposit a conductor such as metal over the surface of the conductive ink lines and over the junctions where the ink lines make connection with the circuit components and with the probe needles. A variety of methods such as electroplating, electroless plating, plasma deposition or ion beam deposition may be employed. To ensure good connections between the plated lines and the probe wires and/or the electronic components the plated lines may be soldered or brazed to make the connections more reliable if required. Advantageously, the conductive ink making the common or ground electrical connections can be extended 46 to make contact with the metallic stiffener ring 12 which then forms a relatively extensive ground plane. If the stiffener ring 12 is nonconducting then the ground connection may be extended 47 over the top of 12 to form an extensive ground plane. The ground connections 46 and 47 may be extended 48 to connect to appropriate conducting lines 22a on the circuit board 21. Some of the possible connections are illustrated in FIG. 4. An electrically insulating coating 44 may be applied over the component 41 and over the conductive ink connections to protect from damage due to mishandling and from corrosive or humid ambient.

Only the tip ends of the probe wires that extend beyond the coaxial shield 35 and the conductive ink path or paths 43 contribute to the probe inductance and the coupling between them. Naturally, the shorter the free ends are, the less the inductance and coupling between them. However, at the same time, the shorter free ends allow for less mechanical compliance and less tolerance for probe damage during overprobing. The result is a less durable probe and less reliable probe contacts. The choices to be made between these conflicting requirements will depend upon the electrical frequency requirements on one hand and probe reliability on the other.

Figure 5:
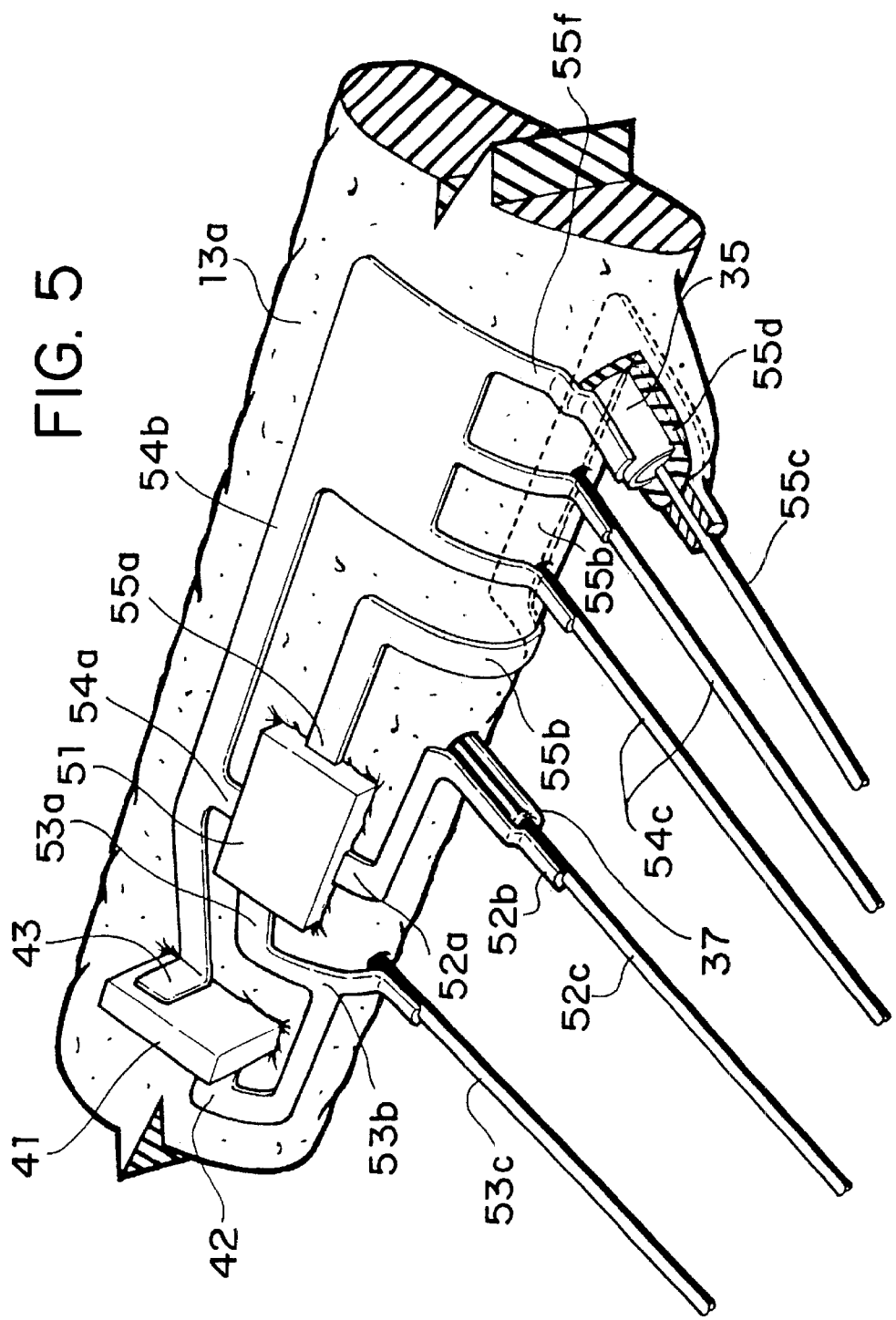
FIG. 5 shows the details of the connections between the probes and an amplifier chip.
Figure 6:
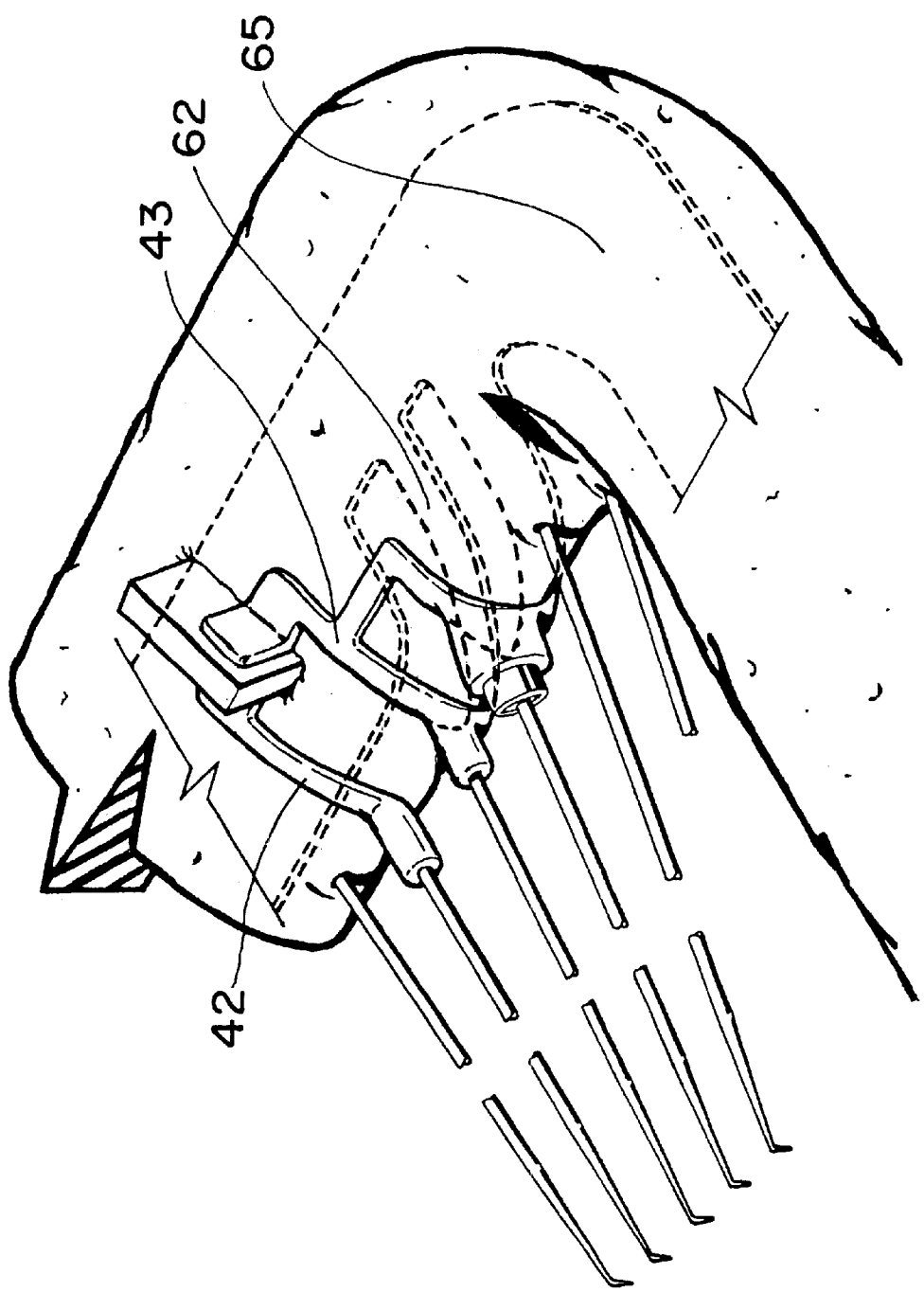
FIG. 6 shows an epoxy probe ring with a grounded metal layer on its underside.

FIG. 5 illustrates a second example of the improved epoxy probe card structure. Here an amplifier in the form of an integrated circuit chip 51 is mounted on the epoxy 13a as shown. The input terminal 52a of the amplifier is connected to the appropriate probe wire 52c via conductive ink strip 52b. The probe wire 52c is advantageously of the type indicated in FIG. 3C because the short metallic probe wire has less capacitance than the longer wires, thus minimizing the capacitive loading of the amplifier input. Similarly, the power terminal 53a is connected via strip 53b to a probe wire 53c that carries power. The ground or common terminal 54a is connected via conducting line 54b to the probe wires carrying ground 54c. The output of the amplifier 55a is connected via a conductive path 55b to the central conductor 55c of a coaxial line. The shield 35 of the coaxial line is connected via conductive path 55f to the ground line 54b. Probe wire 55c may extend toward the tip as shown in FIG. 3B to make contact with the circuit under test, or it may be cut short as indicated in FIG. 5 to serve as an output to the test apparatus as indicated by 25a and 25b in FIG. 2. The capacitor 41 connected between power and ground in FIG. 5 serves the same bypass function as that discussed in connection with FIG. 4. FIG. 5 also illustrates how additional flexibility in connecting the probe wires and the electronic components to the test apparatus may be effected by making use of the bottom surface of the epoxy probe card. FIG. 5 shows that the amplifier output connection to the signal wire of the coaxial line can be made by extending the conductive strip 55b onto the bottom surface of the epoxy probe card. This avoids the need for an insulating crossover that would be necessary if only the top surface of the epoxy were employed. To avoid short circuiting the line 55b to the coaxial line shield 55c, it is necessary to provide an insulating layer 55d over a portion of the end of the coaxial line. FIG. 6 illustrates how the electrical coupling between the probe wires can be reduced by painting a large part of the bottom surface of the probe card with a conductive layer 65 to form a ground plane. A conductive path 62 connects the top surface metallization to the bottom surface metallization 65. In general, it is inconvenient to mount components such as the capacitor 41 as shown in FIG. 4 or the operational amplifier 51 on the lower surface of the epoxy probe card because the clearance between that surface and the semiconductor wafer during testing is very small. However, with sufficiently small size components the bottom surface or the space between the probe wires could be utilized also.

Figure 7:
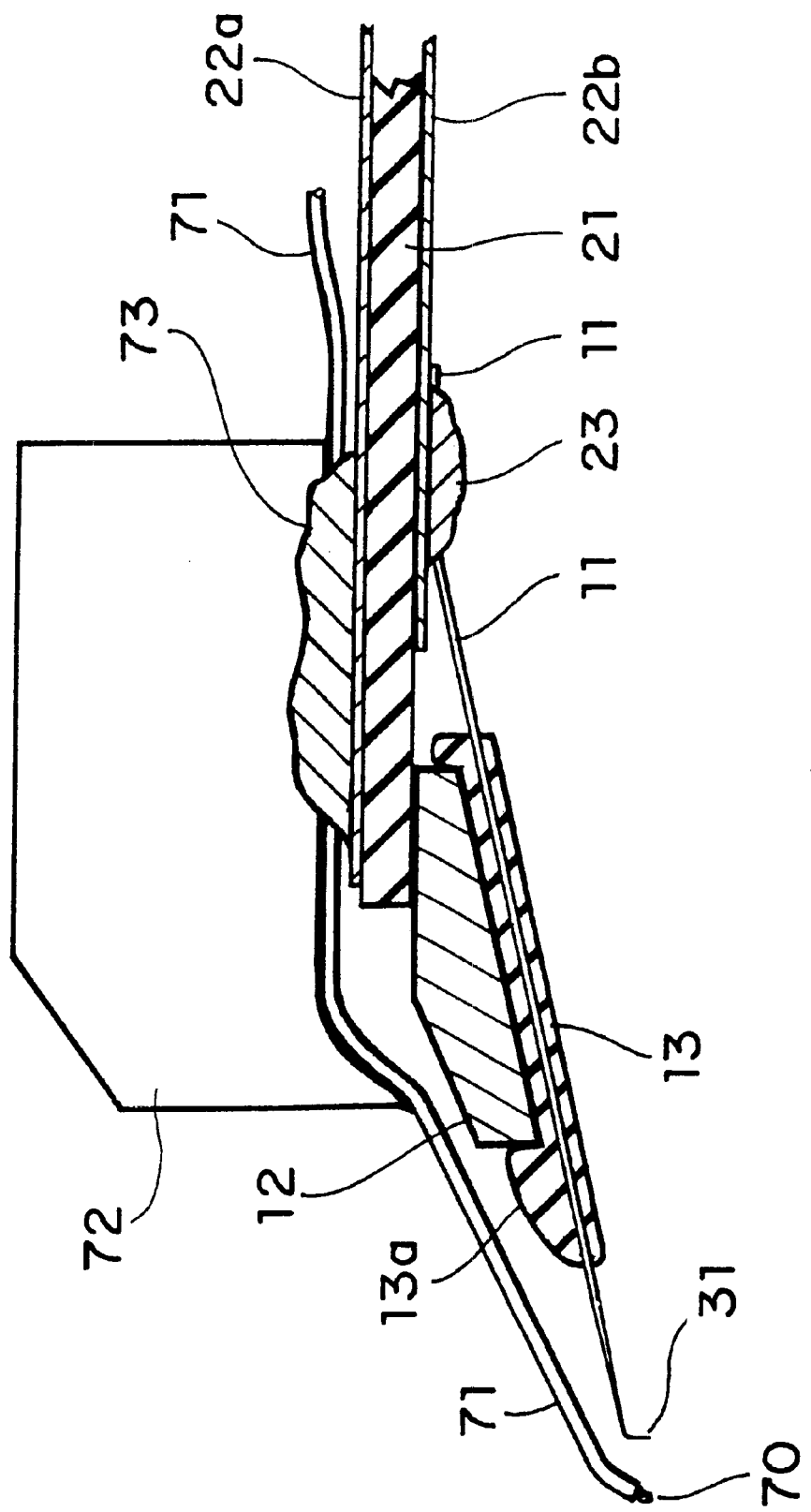
FIG. 7 shows an auxiliary probe mounted on the circuit board in addition to the epoxy probe card.

FIG. 7 illustrates an auxiliary probe mounted on an epoxy probe card after the epoxy probe card has been assembled. The example shown is a microwave probe 71 of the type disclosed in U.S. Pat. No. 4,871,964. The outer conductor of the coaxial transmission line portion of the microwave probe is fastened by soldering or brazing or gluing to a mounting member called a blade 72. During assembly, the probe card is positioned so the probe points of the probe needles 11 of the probe card are positioned properly to contact the probe pads of the integrated circuit chip to be tested. Then using the blade 72 as a holder, the microwave probe 71 is positioned so that the probe tips of the microwave probe contact the proper probe pads on the integrated circuit. The blade is then braised or soldered or glued 73 to the printed circuit board 21 that holds the epoxy probe card. In this way, special purpose probes such as microwave coaxial probes or very low input capacitance probes may be added to the epoxy probe card when ordinary wire probes or coaxial lines with relatively long probe wires do not meet the high frequency and/or low capacitance requirements of a particular design. Other types of special purpose probes may also be added in this way. For example, a probe that provides a high impedance current source, or a probe to provide a fixed or variable inductance or capacitance load to a particular part of the circuit being tested may be implemented in the same way.

Figure 8:
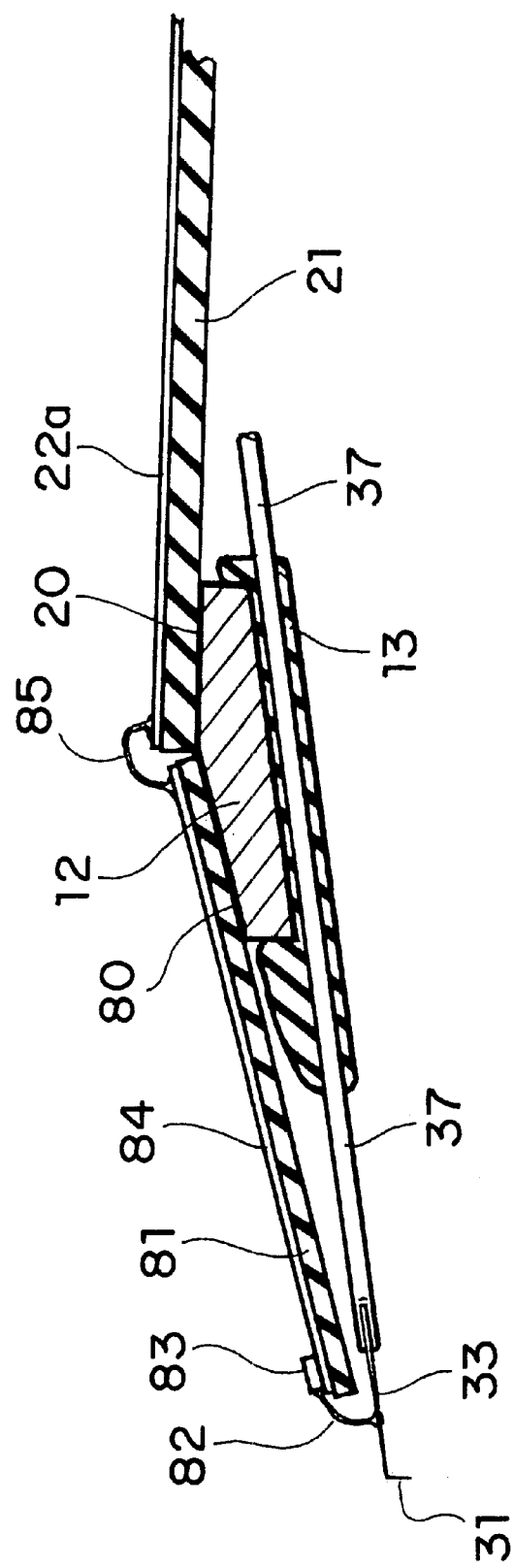
FIG. 8 shows an auxiliary circuit board mounted on the epoxy probe card with connection to the metallic tip of a probe with an insulating shank.

An additional design innovation is illustrated in FIG. 8. Here a miniature auxiliary board 81 is mounted on the completed epoxy probe card and metallic probe wires of the type illustrated in FIG. 3C are connected by a short, flexible electrically conducting wire or thin strip 82 to an electronic component such as an amplifier 83 mounted on the auxiliary board 81. Electrical connecting lines 84 on board 81 carry the electrical signals via a connection 85 to the electrical connecting lines 22a on circuit board 21 that connects to testing instruments as indicated in FIG. 2. Although FIG. 8 shows conducting lines on only the top surface of board 81, both the top and bottom surfaces may contain electrically conducting traces with plated through holes to make connections between the top and bottom conductors. Boards 21 and 81 may be multilayered. The electrically conducting lines on board 81 may be configured to provide controlled impedance transmission lines in standard ways. Board 81 may be rigid in which case the wire or strip 82 must be very flexible to allow the probe needle tip 31 to move when the probe tip contacts the chip to be tested. Alternatively, the auxiliary board 81 may be constructed of a thin, flexible membrane to allow movement of tip 31. In this case the connection 82 may be rigid or flexible. The electrically conducting lines on the flexible membrane may be connected directly to the probe wires by soldering or other methods without the use of a separate wire 82. Also, although only a probe of the type shown in FIG. 3C is indicated in FIG. 8, it is obvious that probes of the type shown in FIGS. 3A and 3B or any other type of probe may also be connected in the same way. In addition, by including an extensive ground plane on board 81 a short connection such as 82 or a direct connection as described above can be made between the ground plane and the needle probe to provide a low inductance ground connection to the chip under test. To provide a low inductance power connection, a bypass capacitor may be mounted on the board and one terminal connected to the ground plane and the other to the probe needle supplying power. In a similar way, the shield 35 of a coaxial probe may be extended toward the tip of its probe wire 31 and a ground connection can then be made to the ground terminal on board 81. Board 81 may be made in separate sections and disposed only in those regions of the probe card where required. This may enhance the durability of the flexible board structure because separate sections are expected to be less rigid than a closed ring.

Although this invention has been described in terms of specific embodiments, it is to be understood that after reading this disclosure, alterations and modifications can be effected by those skilled in the art. For example, the epoxy surface 13*a* of the epoxy probe card may be covered with another layer of insulating material before the components illustrated in FIGS. 4 and 5 are affixed, and/or the epoxy surface may be smoothed or machined to facilitate the application of the electronic components. In place of the conductive inks one could employ wires for the interconnections. Also, although throughout this specification we have indicated a full epoxy probe card in the form of a complete ring, it is obvious that one could employ similar methods to construct a probe card covering only a sector of the complete ring. Accordingly, it is intended that the appended claims be interpreted as covering all alterations and modifications that fall within the true spirit and scope of this invention.

We claim:

1. An electronic probe apparatus for testing an electronic circuit comprising an array of probe wires having tip ends adapted to contact said electronic circuit, said probe wires extend outward from said tip ends and extend into an epoxy material and are held in place therein, said epoxy material has an electrically insulating surface and has electronic components mounted on said insulating surface, connections are being made between said components and said probe wires by electrically conducting lines formed on said insulating surface of said epoxy material, said connections are being made between said conducting lines and said probe wires between said tip ends and said epoxy material.

2. The electronic probe apparatus of claim 1, wherein said electrically conducting lines consist of electrically conductive inks applied to said electrically insulating surface of the epoxy probe card.

3. The electronic probe apparatus of claim 1, wherein said electrically conducting lines consist of electrically resistive inks applied to said insulating surface of said epoxy probe card.

4. The electronic probe apparatus of claim 1, wherein at least a portion of said electrically conducting lines are overplated with a metallic coating to improve the reliability of the connections.

5. An electronic probe apparatus for testing an electronic circuit comprising an array of probe wires having tip ends adapted to contact said electronic circuit, said probe wires extend outward from said tip ends and extend into an epoxy material and are held in place therein, said epoxy material has an electrically insulating surface and has electrical conductors mounted on said insulating surface, connections are being made between said electrical conductors and said probe wires on said insulating surface of said epoxy material, said connections are being made between said conducting lines and said probe wires between said tip ends and said epoxy material.

* * * * *